United States Patent [19]

Sansregret

[11] 4,311,728

[45] Jan. 19, 1982

[54] METHOD FOR DEPOSITING PHOTOCONDUCTIVE ZINC TIN PHOSPHIDE

[75] Inventor: Joseph L. Sansregret, Scotch Plains, N.J.

[73] Assignee: Exxon Research & Engineering Co., Florham Park, N.J.

[21] Appl. No.: 200,454

[22] Filed: Oct. 24, 1980

[51] Int. Cl.$^3$ ............................................ H01L 31/18
[52] U.S. Cl. ................................... 427/74; 427/255.2
[58] Field of Search .............................. 427/74, 255.2

[56] References Cited

PUBLICATIONS

Rubenstein et al., "Preparation and Characteristics of Zinc Tin Phosphide", Journal of Physics and Chemistry of Solids, vol. 29, pp. 551–552, (1968).

Mughal et al., "Preparation and Phase Studies of the Ternary Semiconductor Compounds Zinc Tin Phosphide, Zinc Germanium Phosphide, Zinc Silicon Phosphide, Cadmium Germanium Phosphide and Cadmium Silicon Phosphide", Journal of Materials Science, vol. 4, pp. 895–901, (1969).

*Primary Examiner*—James R. Hoffman
*Attorney, Agent, or Firm*—Paul E. Purwin

[57] ABSTRACT

Invention teaches a combined chemical vapor deposition/thermal ion exchange method for producing photoconductive thin films of zinc tin phosphide. A layer of tin oxide is converted to zinc tin phosphide by annealing in the presence of gaseous phosphine and zinc metal vapor or zinc chloride vapor. The thin film zinc tin phosphide taught by the present invention is amenable to use in large area applications such as solar cells and the like.

15 Claims, No Drawings

METHOD FOR DEPOSITING PHOTOCONDUCTIVE ZINC TIN PHOSPHIDE

BACKGROUND OF THE INVENTION

The present invention relates to thin film ternary chalcopyrite semiconductors and in particular to a combined chemical vapor deposition/thermal ion exchange process for producing photoconducting films of zinc tin phosphide.

The subject invention was made in the course of research performed for the Solar Energy Research Institute under contract XS-9-8041-11.

Zinc tin phosphide (hereinafter $ZnSnP_2$) has heretofore been prepared from solution growth techniques in which constituent elements were combined at their melting points to form the ternary compound. The specific example of this technique may be referenced in a technical publication entitled "Preparation and Characteristics of Zinc Tin Phosphide" by M. Rubenstein et al published in the *Journal of Physics and Chemistry of Solids*, Volume 29, pages 551–552 (1968). The solution growth technique typically results in very small crystallites having their largest dimension on the order of millimeters. In contrast the present invention is directed to a technique for producing thin films of zinc tin phosphide which may be used in large area applications. Process for producing these films includes both a chemical vapor deposition and a thermally induced ion exchange.

An alternative technique for the preparation of ternary zinc tin phosphide is taught by S. A. Mughal et al in a technical publication entitled *"Preparation and Phase Studies of the Ternary Semiconductor Compounds Zinc Tin Phosphide, Zinc Germanium Phosphide, Zinc Silicon Phosphide, Cadmium Germanium Phosphide and Cadmium Silicon Phosphide"* published in the Journal of Materials Science, Volume 4, Pages 895–901 (1969). Mughal et al teaches the use of a carrier gas comprising iodine or chlorine to transport the constituents of the ternary compound. As taught therein, the ternary chalcopyrite semiconductor is prepared by heating its elemental constituents in a sealed ampule containing an amount of the carrier gas. A cooled region of the ampule serves to nucleate crystallites of the desired compound. In contrast the present invention teaches the preparation of thin films of photoconductive zinc tin phosphide from a process that is believed to comprise the chemical vapor conversion of tin oxide to a zinc tin oxide and concurrently ion exchanging the oxygen for phosphorous to form the desired film of zinc tin phosphide.

SUMMARY OF THE INVENTION

The present invention teaches a method for producing photoconductive films of zinc tin phosphide. A substrate coated with a layer of tin oxide is annealed in a gaseous mixture of hydrogen, nitrogen, phosphine, and zinc metal vapor or zinc chloride vapor at a temperature ranging from about 350° C. to about 500° C. It is believed that the tin oxide undergoes a chemical vapor conversion to the mixed zinc tin oxide and further undergoes a thermally induced ion exchange whereby phosphide ions are substituted for the oxygen ions to produce photoconductive zinc tin phosphide. In its thin film form, the zinc tin phosphide photoconductor of the present invention is amenable to use in large area applications such as solar cells or the like.

DETAILED DESCRIPTION OF THE INVENTION

In accordance with the teaching of the present invention, thin films of photoconductive zinc tin phosphide are fabricated by first depositing a layer of tin oxide onto a substrate. The preparation of tin oxide in thin film form is generally known in the art and comprises no part of the present invention. Alternate techniques such as chemical vapor deposition, spray pyrolsis and sputtering provide satisfactory films of tin oxide for use in the present invention. In a preferred embodiment, polycrystalline thin films of tin oxide evidencing a preferred crystalline orientation of <110> provide a starting constituent in the preparation of zinc tin phosphide. In the further preferred embodiment, the tin oxide coated substrate is annealed in a reducing atmosphere containing an amount of hydrogen as a means of establishing tin oxide films of the proper conductivity and/or proper crystallinity.

The tin oxide coated substrate is then annealed at an elevated temperature in an ambient containing partial pressures of gaseous zinc or zinc chloride in phosphine. The annealing is generally carried out at temperatures ranging from about 350° C. to about 500° C. and in a preferred embodiment, at a temperature of about 425° C. The annealing gases are accompanied by a carrier or transport gas mixture of nitrogen and hydrogen. The phosphine annealing gas is provided by bubbling through water a gaseous mixture of hydrogen and nitrogen having flow rates ranging from about 5 cubic centimeters per minute to 50 cubic centimeters per minute and 30 cubic centimeters per minute to 300 cubic centimeters per minute, respectively. This gaseous mixture is then contacted with a drying bed of calcium phosphide where phosphine is generated by the reaction $$Ca_3P_2 + 3H_2O \rightarrow 2PH_3 + 3CaO$$

This results in a gaseous mixture of hydrogen, nitrogen and phosphine. To complete the annealing gas, a partial pressure of zinc metal vapor, or zinc chloride vapor is added to the above described mixture of hydrogen, nitrogen and phosphine. In one embodiment, mossy zinc metal is heated to a temperature ranging from about 350° C. to about 500° C. in the flowing hydrogen, nitrogen and phosphine adding a partial pressure of zinc metal vapor resulting in a gaseous mixture of the four constituent gases, hydrogen, nitrogen, phosphine and zinc metal vapor. Alternatively, zinc chloride may be substituted for the mossy zinc metal whereupon heating to a temperature ranging from about 350° C. to about 500° C. will also provide the requisite partial pressure of zinc chloride vapor.

In one embodiment, the tin oxide coated substrate is placed in a tube furnace which is maintained in the requisite annealing temperature range of between about 350° C. and about 500° C. The gaseous mixture of nitrogen, hydrogen, zinc metal vapor and phosphine is flowed through the annealing tube furnace at a flow rate ranging from about 80 cm³/min to about 100 cm³/min. A nominal positive pressure (above atmospheric pressure) is maintained in the tube to avoid backfilling the tube furnace with unwanted atmospheric gases. The duration of annealing is dependent both upon the annealing temperature selected and the thickness of tin oxide to be converted to zinc tin phosphide. For example, a layer of tin oxide having a thickness of about 4,000 angstroms evidences a requisite annealing time of about 270 minutes to assure virtually complete conversion of the tin oxide to zinc tin phosphide.

As presently understood, a deposition method taught herein includes both a chemical vapor deposition and a thermally induced ion exchange. It is believed that the volatile zinc specie reacts with the tin oxide film to form a ternary zinc tin oxide. The ternary oxide film then undergoes ion exchange wherein phosphide ions are exchanged for oxide ions, thus forming zinc tin phosphide.

The crystalline structure of the film, although dependent upon the structure of the initial film of tin oxide is generally polycrystalline, evidencing, in some instances, a preferred orientation of <112>. Optical characterization of the zinc tin phosphide revealed a band gap of 1.5 e.V. which is ideally suited for solar applications such as solar photovoltaic devices.

To further enable one skilled in the art in the practice of the present invention, the following examples detail specific embodiments of the invention.

EXAMPLE I

A tin oxide coated glass substrate, commercially obtainable from Corninng Glass Corporation (Corning EC7059 Glass) was placed into a Pyrex tube in a single zone tube furnace. The tin oxide had a thickness of about 4,000 angstroms and a sheet resistivity of between about 100–200 ohms per square. The starting tin oxide film exhibited X-ray diffraction peaks at 3.22 Å, 2.302 Å and 1.732 Å with the peak at 3.22 Å being of highest intensity, indicating a preferred orientation with the <110> plane parallel to the substrate.

X-ray diffraction patterns verified and characterized the starting tin oxide film for comparison to the resultant $ZnSnP_2$ film.

A combustion boat containing several grams of ACS grade mossy zinc metal was placed into the tube approximately 2–4 centimeters from the tin oxide film. Gaseous phosphine was provided by first bubbling a gas mixture of hydrogen and nitrogen through water at or just above room temperature. The gaseous mixture was then passed through a drying bed of calcium phosphide where the phosphine ($PH_3$) was generated by the reaction $$Ca_3P_2 + 3H_2O \rightarrow 2PH_3 + 3CaO$$

The gaseous mixture of hydrogen, nitrogen and phosphine flowed through the tube furnace over the combustion boat containing mossy zinc metal and further over the tin oxide films. The temperature of the tube furnace was then raised to about 425° C. maintaining a hydrogen flow rate of about 7.5 cubic centimeters per minute and a nitrogen flow rate of about 80 cubic centimeters per minute, respectively. The annealing continued for a period of about 270 minutes, whereafter the temperature of the tube furnace was slowly lowered to room temperature and the gaseous mixture of hydrogen, nitrogen, phosphine and zinc metal vapor was deleted passing only nitrogen over the cooling film.

The composition of the films was determined by X-ray diffractometry. The zinc tin phosphide composition was verified by computing the interplanar d spacing from the observed X-ray reflections and comparing these spacings with those calculated from the crystallographic structure of zinc tin phosphide previously reported for single crystal preparation. The observed interplanar spacings and their assignment to crystallographic planes denoted by Miller indices (hkl) are listed in Table I herebelow.

TABLE I

| $d_{obs}$(Å) | Assignment (hkl) | $d_{calc}$(Å) |
|---|---|---|
| 3.225 | $ZnSnP_2$ (112) | 3.262 |
| 3.136 | $ZnSnP_2$ (013,103) | 3.135 |
| 2.820 | $ZnSnP_2$ (200,020) | 2.826 |
| 2.701 | $ZnSnP_2$ (201,021) | 2.741 |
| 2.639 | $SnO_2$ (101) | — |
| 2.304 | $ZnSnP_2$ (212) | 2.307 |

The optical properties of the resultant film were characterized by absorption spectra which indicated a band to band absorption at about 1.5 e.V. The photoconductive characteristics of the film are characterized by a change in resistivity on exposure to light. In one experiment where non-ohmic contact was made to the films by means of a drop of 2-methoxyethanol, a constant current was made to flow through the film and the voltage required to maintain that current under light (room lights, about 0.01 AMI) and dark conditions were recorded. Data points for a typical film are given below.

| Current (nA) | Voltage (mV) | |
|---|---|---|
|  | Dark | Light |
| 100 | 88 | 91 |
| 500 | 231 | 214 |
| 1000 | 423 | 416 |

As can be seen, the films exhibit a change in conductivity on exposure to light.

EXAMPLE II

The deposition process of Example II is substantially identical to that of Example I with the exception that the Zn-source contained several grams of $ZnCl_2$ rather than Zn-metal as in Example I. The tin oxide films were annealed at 500° C. for three (3) hours. The composition of the resultant films was verified as in FIG. I by X-ray diffraction detailed in Table II herebelow.

TABLE II

| $d_{obs}$(Å) | Assignment (hkl) | $d_{calc}$(Å) |
|---|---|---|
| 3.705 | $ZnSnP_2$ (111) | 3.767 |
| 3.404 | $SnO_2$ (110) | — |
| 2.837 | $ZnSnP_2$ (200,020) | 2.826 |
| 2.526 | $ZnSnP_2$ (210) | 2.527 |
| 2.325 | $ZnSnP_2$ (212) | 2.307 |

What is claimed is:

1. A method for producing photoconductive films of zinc tin phosphide comprising:
    coating a substrate with a layer of tin oxide;
    annealing said coated substrate in an ambient containing partial pressures of gaseous zinc or zinc chloride and phosphine at temperatures ranging from about 350° C. to about 500° C. whereby said tin oxide layer is converted to a layer of zinc tin phosphide.

2. The method of claim 1 wherein said ambient comprises a mixture of nitrogen, hydrogen, zinc metal vapor and phosphine.

3. The method of claim 2 wherein said zinc metal vapor is provided by heating an amount of zinc metal to a temperature in a region proximate to said tin oxide.

4. The method of claim 1 wherein said ambient comprises a mixture of nitrogen, hydrogen, zinc chloride vapor and phosphine.

5. A method for producing photoconductive films of zinc tin phosphide comprising;
- coating a substrate with a layer of tin oxide;
- annealing said coated substrate at a temperature ranging from about 350° C. to about 500° C. in an ambient comprising a flowing gaseous mixture of nitrogen, hydrogen, zinc metal vapor or zinc chloride vapor and phosphine, whereby said tin oxide is converted to zinc tin phosphide.

6. The method of claim 5 wherein said flowing gaseous mixture is further characterized as including nitrogen flowing at a rate ranging from about 30 cm$^3$/min to about 300 cm$^3$/min.

7. The method of claim 6 wherein said flowing gaseous mixture is further characterized as including hydrogen flowing at a rate ranging from about 5 cm$^3$/min to about 50 cm$^3$/min.

8. The method of claim 7 wherein said coated substrate is annealed at a temperature of about 425° C.

9. The method of claim 7 wherein said annealing continues for a period ranging from about 90 minutes to about 300 minutes.

10. The method of claim 8 wherein said coated substrate is annealed for about 270 minutes.

11. The method of claim 5 wherein said zinc metal vapor is provided by heating zinc metal to a temperature ranging from about 350° C. to about 500° C.

12. The method of claim 5 wherein said zinc chloride vapor is provided by heating zinc chloride to a temperature ranging from about 350° C. to about 500° C.

13. The method of claim 5 wherein said layer of tin oxide is about 4000 Å in thickness.

14. The method of claim 13 wherein said layer of zinc tin phosphide is about 6000 Å in thickness.

15. A method for producing photoconductive films of zinc tin phosphide comprising:
- coating a substrate with a layer of tin oxide;
- bubbling a gaseous mixture of hydrogen and nitrogen, each having flow rates ranging from about 5 cm$^3$/min to 50 cm$^3$/min and 30 cm$^3$/min to 300 cm$^3$/min respectively, through water and further, contacting said gaseous mixture with an amount of calcium phosphide to produce a gaseous mixture of hydrogen, nitrogen and phosphine;
- contacting said gaseous mixture of hydrogen, nitrogen and phosphine with zinc metal or zinc chloride heated to a temperature ranging from about 350° C. to about 500° C. to provide a gaseous mixture comprising hydrogen, nitrogen, phosphine and zinc metal vapor or zinc chloride vapor;
- annealing said tin oxide coated substrate in said gaseous mixture of hydrogen, nitrogen, phosphine and zinc metal vapor or zinc chloride vapor at a temperature ranging from about 350° C. to about 500° C. wherein said tin oxide is converted into photoconductive zinc tin phosphide.

* * * * *